(12) United States Patent
Fastow et al.

(10) Patent No.: US 6,768,683 B1
(45) Date of Patent: Jul. 27, 2004

(54) LOW COLUMN LEAKAGE FLASH MEMORY ARRAY

(75) Inventors: Richard Fastow, Cupertino, CA (US); Sameer Haddad, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 109 days.

(21) Appl. No.: 10/095,739

(22) Filed: Mar. 12, 2002

(51) Int. Cl.[7] .............................................. G11C 16/04
(52) U.S. Cl. .......................... 365/185.33; 365/185.05; 365/185.07
(58) Field of Search ................... 365/185.33, 185.01, 365/185.05, 185.07

(56) References Cited

U.S. PATENT DOCUMENTS 6,515,910 B1 * 2/2003 Lee et al. ............... 365/185.22
6,515,911 B2 * 2/2003 Campardo et al. ...... 365/185.23

* cited by examiner

Primary Examiner—Thong Le

(57) ABSTRACT

The present memory includes a plurality of transistors laid out in a number of rows and columns. First and second series-connected transistors are included in a first column, and are connected between first and second bit lines and are respectively associated with first and second word lines. A region between the series-connected first and second transistors is connected to a first bit line. Third and fourth series-connected transistors are included in a second column, and are connected between the second bit line and a third bit line and are respectively associated with third and fourth word lines. A region between the series-connected third and fourth transistors is connected to a second bit line. The first, second, third and fourth transistors are respective parts of first, second, third and fourth rows of transistors.

11 Claims, 5 Drawing Sheets

LOW COLUMN LEAKAGE FLASH MEMORY ARRAY

BACKGROUND OF THE INVENTION

1. Technical Field

This invention relates generally to semiconductor memory arrays, and more particularly, to such an array incorporating flash memory cells.

2. Background Art

One type of programmable memory cell is commonly referred to as the flash memory cell. The structure of one type of flash memory cell includes a source and a drain formed in a silicon substrate. The structure of another type of flash memory cell includes a source and a drain formed in a well that is formed in a silicon substrate. The flash memory cell includes a stacked gate structure formed on the silicon substrate. The region of the silicon substrate beneath the stacked gate structure is known as the channel region of the flash memory cell.

The stacked gate structure of a flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer.

Programming operations on the flash memory cell involve application of a relatively large constant voltage to the drain of the flash memory cell while an even larger voltage is applied to the control gate. During such programming operation, the source of the flash memory cell is maintained at a ground level or a zero voltage level in relation to the voltages applied to the control gate and drain.

Such a relatively high voltage potential applied between the drain and source causes electrons to flow through the channel region from the source to the drain. The electrons flowing between the source and drain can obtain relatively high kinetic energy levels near the drain. In addition, the high constant voltage applied to the control gate raises the voltage potential of the floating gate to a high level at the start of the programming operation. Such a high voltage potential on the floating gate usually attracts the electrons flowing through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve the desired threshold voltage for the flash memory cell. The threshold voltage is the voltage that must be applied to the control gate of the flash memory cell to cause conduction through the channel region during a read operation on the flash memory cell. The time involved in a programming operation depends upon the rate at which electrons are injected onto the floating gate.

The microelectronic flash or block-erase Electrically Erasable Programmable Read-Only Memory (Flash EEPROM) includes an array of cells that can be programmed and read. The size of each cell and thereby the memory are made small by omitting transistors known as select transistors that would enable the cells to be erased independently. As a result, all of the cells must be erased together as a block.

A flash memory device of this type includes individual metal-oxide-semiconductor (MOS) field effect transistor (FET) memory cells. Each of the FETs includes a source, a drain, a floating gate, and a control gate to which various voltages are applied to program the cell with a binary 1 or 0, to read the cells, or to erase all of the cells as a block.

The cells are connected in an array of rows and columns, with the control gates of the cells in a row being connected to a respective word line and the drains of the cells in column being connected to a respective bit line. The sources of the cells are connected together. This arrangement is known as a NOR memory configuration.

A cell is programmed by applying programming voltage as follows: a voltage, typically in the range of 9–10 volts to the control gate, a voltage of approximately 5 volts to the drain and grounding the source. As disscussed above, these voltages cause electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

A cell is read by applying a voltage of about 5 volts to the control gate, applying about 1 volt to the bit line to which the drain is connected, grounding the source, and sensing the bit line current. If the cell is programmed and the threshold voltages is relatively high (4 volts), the bit line current will be zero or at least relatively low. If the cell is not programmed or erased, the threshold voltage will be relatively low (2 volts), control gate voltage will enhance the channel, and the bit line current will be relatively high.

A cell can be erased several ways. In one arrangement, applying a relatively high voltage, typically 12 volts, to the source, grounding the control gate and allowing the drain to float erases the cell. This causes the electrons that were injected into the floating gate during programming to undergo Fowler-Nordheim tunneling from the floating gate through the thin oxide layer to the source. Applying a negative voltage on the order of −10 volts to the control gate, applying 5 volts to the source and allowing the drain to float can also erase a cell. Another method of erasing a cell is by applying 5 volts to the P-well and −10 volts to the control gate while allowing the source and drain to float.

A problem with conventional flash EEPROM cells is that because of manufacturing tolerances, some cells become over-erased before other cells become sufficiently erased. The floating gates of the over-erased cells are either completely or partially depleted of electrons and having a very low negative charge or become positively charged. The over-erased cells can function as depletion mode transistors that cannot be turned off by normal operating voltages applied to their control gates and introduce leakage current to the bit line during subsequent programming and read operations. The slightly overerased cells can introduce varying amounts of leakage current to the bit line depending on the extent of overerasure.

More specifically, during program and read operations only one word line is held high at a time, while the other word lines are grounded. However, because a positive voltage is applied to the drains of all the cells on the bit line and if the threshold voltage of an unselected cell is very low, zero or negative, a leakage current will flow through the source, channel and drain of the cell.

The undesirable effect of leakage current is illustrated in FIG. 1, which is a simplified electrical schematic diagram of a column 100 of flash EEPROM cells 102, 104, 106, 108.

The sources of the column 100 of transistors are all connected to a source supply voltage $V_s$. A programming or read voltage $V_{cg}$, is applied to be control gate of the transistor 104, which turns it on. A current $I_2$ flows through the transistor 104 from ground through the source, channel (not shown) and drain. Ideally, the bit line current $I_{bl}$ is equal to $I_2$. However, if one or more of the unselected transistors, for example, transistors 102, 106, 108 as illustrated in FIG. 1, are overerased or slightly overerased, their threshold voltages will be very low, zero or even negative, and background leakage currents $I_1$, $I_3$, $I_4$ could flow through the transistors 102, 106 and 108 respectively. The bit line current $I_{bl}$ would then be equal to the sum of $I_2$ and the background leakage currents $I_1$, $I_3$, $I_4$. In a typical flash EEPROM, the drains of a large number of memory transistor cells, for example 512 transistors cells are connected to each bit line. If a substantial number of cells on the bit line are drawing background leakage current, the total leakage current on the bit line can exceed the cell read current. This makes it impossible to read the state of any cell on the bit line and therefore renders the memory inoperative.

Therefore, what is needed is a memory array wherein leakage cure is reduced.

DISCLOSURE OF THE INVENTION

The present invention is a memory array including a plurality of word lines and a plurality of bit lines. A first transistor is associated with a first word line and is connected in series with a second transistor associated with a second word line. The series-connected first and second transistors are connected between first and second bit lines. A region between the series-connected first and second transistors is connected to the first bit line. A third transistor is associated with third word line and is connected in series with a fourth transistor associated with a fourth word line. The series-connected third and fourth transistors are connected between the second bit line and a third bit line, a region between the series-connected third and fourth transistors being connected to the second bit line. The first, second, third and fourth transistors are respective parts of first, second, third and fourth rows of transistors, while the first and second transistors are part of a first column of transistors, while the third and fourth transistors are part of a second column of transistors.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claim. The invention itself, however, as well as said preferred mode of use, and further objects and advantages thereof, will best be understood by reference to the following detailed description of illustrative embodiments when read in conjunction with the accompanying drawings, wherein:

FIG. 4 is a view showing the connections of bit lines to the various transistors of the array of FIGS. 2 and 3.

BEST MODE(S) FOR CARRYING OUT THE INVENTION

Figure 1:
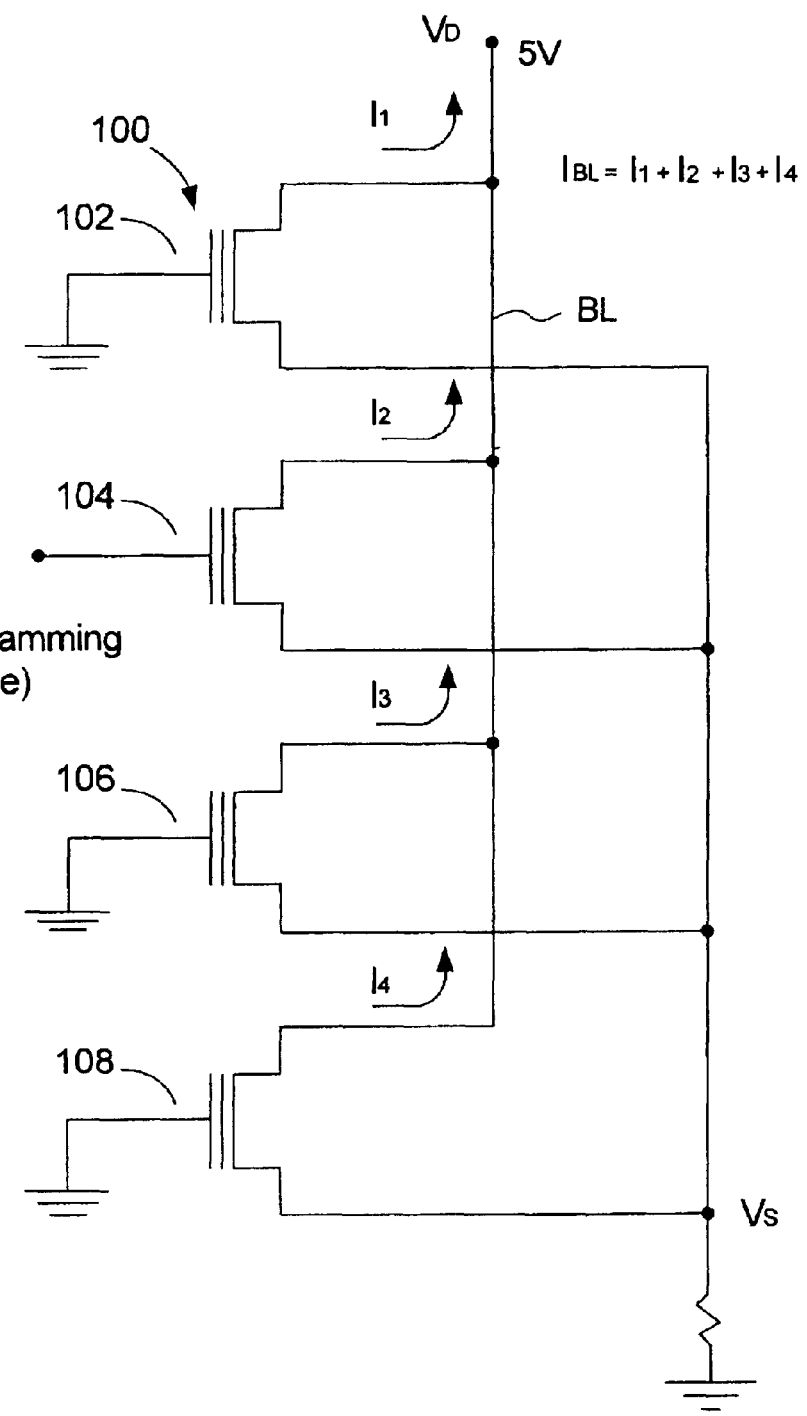
FIG. 1 is a schematic view of a memory array of the prior art.

Reference is now made in detail to specific embodiments of the present invention which illustrate the best mode presently contemplated by the inventors for practicing the invention.

The present memory array will be described with reference to FIGS. 2 and 3, which show a portion of the array in a schematic and layout form. Initially with reference to FIG. 2, the array 300 includes individual cells C1–C32 made up of individual respective MOS field effect transistors T1–T32, each of the transistors including a source S, a drain D, a floating gate FG, and a control gate CG. The transistors T1–T32 are arranged in an array of successive columns 302, 304, 306, 308, column 302 including transistors T4, T8, T12, T16, T20, T24, T28, T32 connected in series, column 304 including transistors T3, T7, T11, T15, T19, T23, T27, T31 connected in series, column 306 including transistors T2, T6, T10, T14, T18, T22, T26, T30 connected in series, column 308 including transistors T1, T5, T9, T13, T17, T21, T25, T29 connected in series. The transistors T1–T32 are also arranged in an array of successive rows 310, 312, 314, 316, 318, 320, 322, 324. Row 310 includes transistors T1, T2, T3, T4, each associated with word line W0, row 312 includes transistors T5, T6, T7, T8, each associated with word line W1, row 314 includes transistors T9, T10, T11, T12, each associated with word line W2, row 316 includes transistors T13, T14, T15, T16, each associated with word line W3, row 318 includes transistors T17, T18, T19, T20, each associated with word line W4, row 320 includes transistors T21, T22, T23, T24, each associated with word line W4, row 322 includes transistors T25, T26, T27, T28, each associated with word line W6, and row 324 includes transistors T29, T30, T31, T32, each associated with word line W7.

Connecting the respective regions A1, A2, A3, A4 (sources) situated between and part of the transistors T1, T5, the transistors T2, T6, the transistors T3, T7, and the transistors T4, T8 is a conductor 330. Another conductor 332 connects the respective regions A5, A6, A7, A8 (sources) situated between and part of the transistors T9, T13, the transistors T10, T14, the transistors T11, T15, and the transistors T12, T16. Likewise, a conductor 334 connects the respective regions A9, A10, A11, A12 (sources) situated between and part of the transistors T17, T21, the transistors T18, T22, the transistors T9, T23, and the transistors T20, T24. Another conductor 336 connects the respective regions A13, A14, A15, A16 (sources) situated between and part of the transistors T25, T29, the transistors T26, T30, the transistors T27, T31, and the transistors T28, T32.

Figure 2:
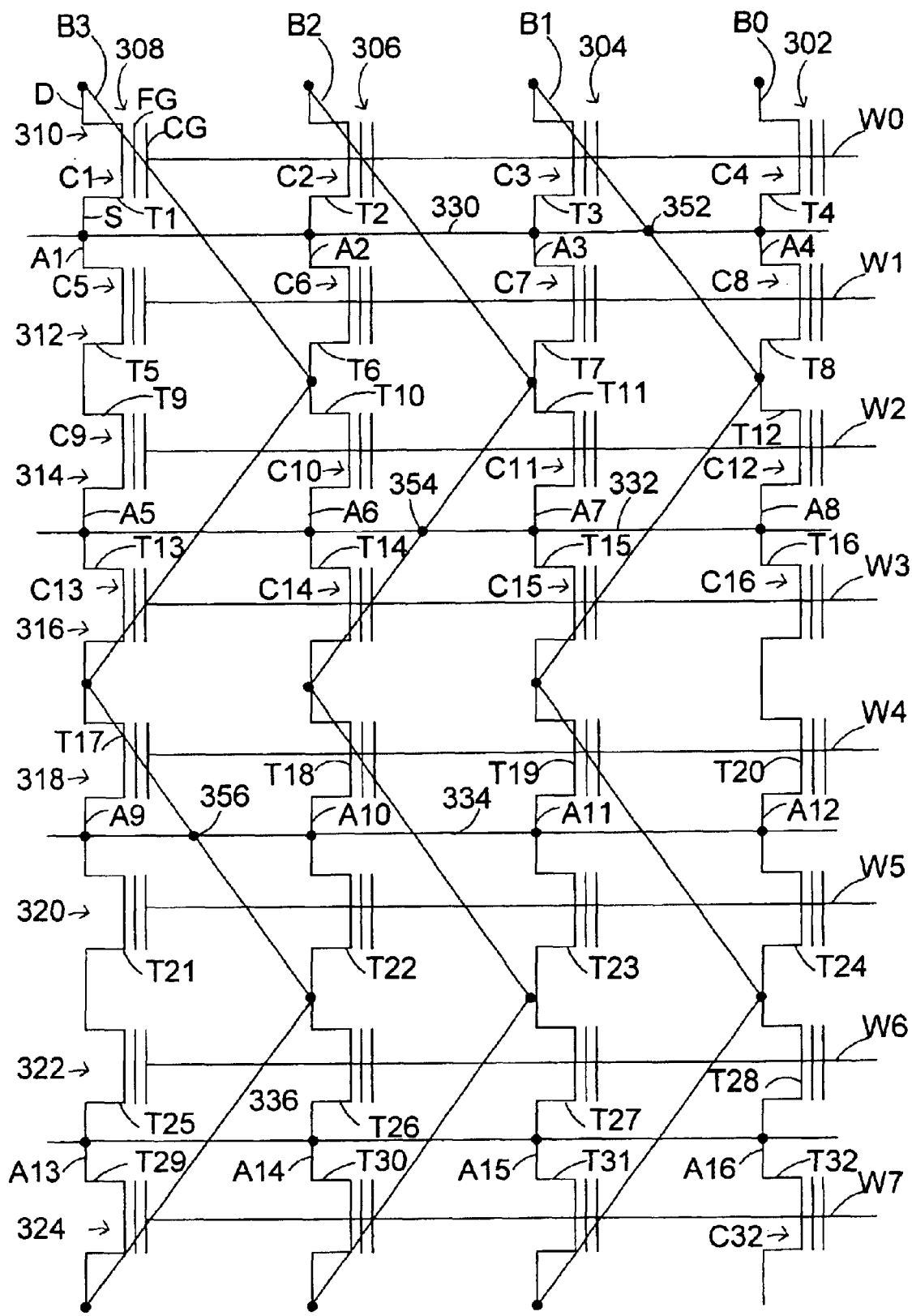
FIG. 2 is a schematic view of the first embodiment of memory array of the present invention.
Figure 3:
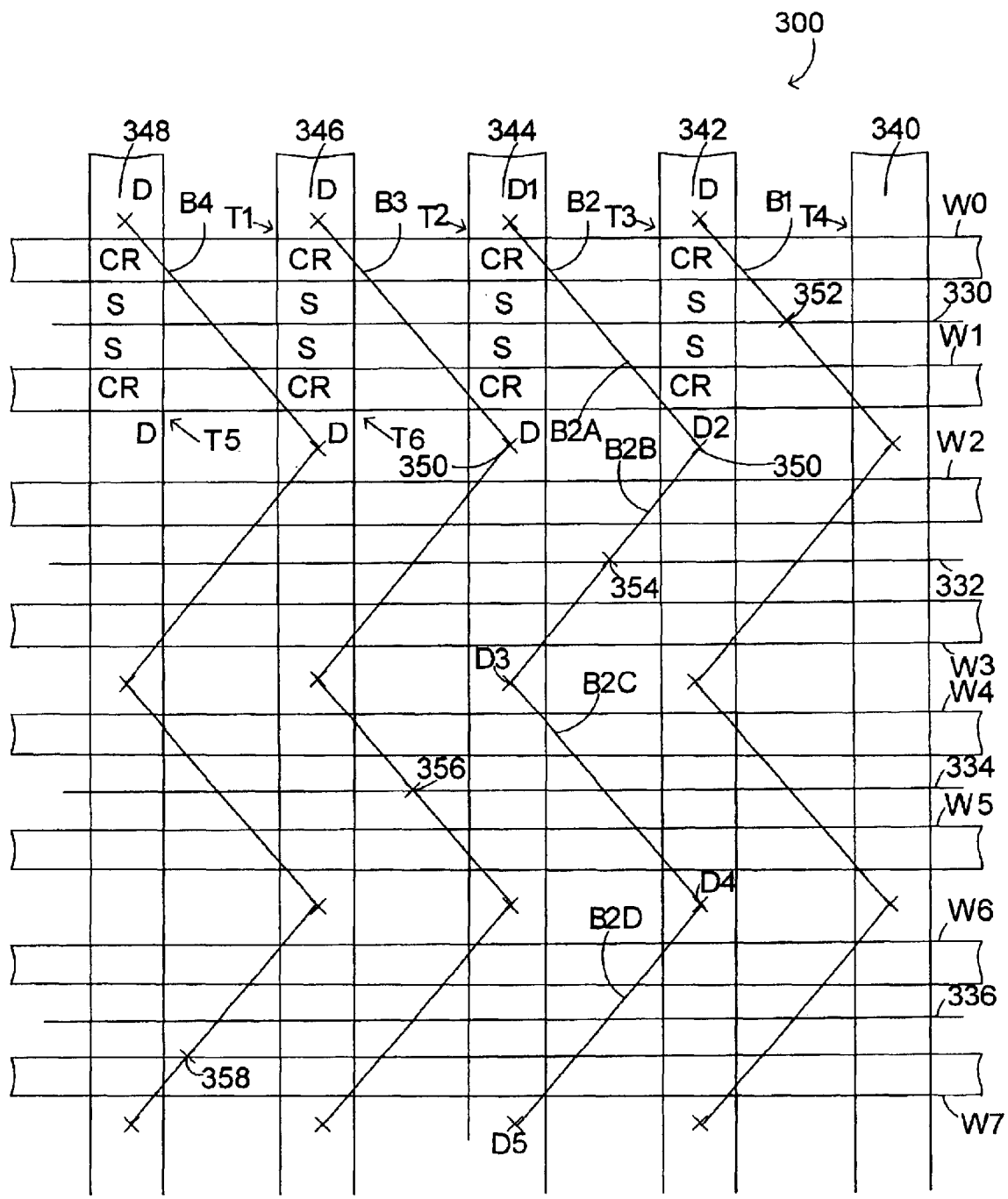
FIG. 3 is a view of the memory array of FIG. 2 shown in layout form.

As shown in FIG. 3, which is the array of FIG. 2 shown in layout form, the layout structure includes a plurality of elongated, substantially straight source/drain regions 340, 342, 344, 346, 348 in side-by-side, parallel relation, which may be formed in a single step by use of the source/drain implant mask. Each region comprises alternating sources S and drains D along its length, with a channel region CR connecting each adjacent source and drain.

The bit lines B1, B2, B3, B4 are each made up of connecting segments (for example B2a, B2b, B2c, etc.), each segment being non-aligned with an adjacent segment, so that each such bit line is of zigzag configuration. Each of the bit lines is connected to the drains D of the source/drain regions by contacts 350 as shown in FIG. 3. That is, for example, bit line B2 is connected to the drain D1 of the source/drain region 344, and then connects to a drain D2 of adjacent source/drain region 342. Moving further along the length of the bit line B2, it is then connected to a drain D3 of the source/drain region 344, a drain D4 of the source/drain region 342, and a drain D5 of the source/drain region 344. It will be seen that each such bit line connects to two adjacent source/drain regions in alternating manner along the bit line length.

The bit line B1 is connected to the conductor 330 by contact 352, the bit line B2 is connected to the conductor 332 by contact 354, the bit line B3 is connected to the conductor 334 by contact 356, and the bit line B4 is connected to the conductor 336 by contact 358 (FIG. 3).

Programming reading, and erasing of a transistor takes place in accordance with the prior description by applying the appropriate voltages to the source and drain of the transistor by means of the bit lines associated with the source and drain of that transistor, and to the gate thereof by means of the appropriate word line. For example, in order to access transistor T15, bit lines B1 and B2 are used. As another example, to access transistor T6, bit lines B1 and B3 are used.

The table of FIG. 4 illustrates the bit lines using to access transistors of the array of FIG. 2, along with additional transistors of the array not shown in FIG. 2.

The present array has the advantage of reduced column leakage as compared to the prior art. A typical prior art sector includes 512 cells connected to a common bit line, so that when selecting a cell, 511 cells connected to the bit line have the potential for providing leakage therethrough. In the present array, it will be noted that in accordance with the table of FIG. 4, when selecting a cell, for example T18, only two other cells (T13 and T23) are directly connected to the same bit line (as compared to 511 previously). Therefore, the potential for leakage is greatly reduced.

For those transistors having a source and drain connected to the same bit line (for exhale, transistor T14, or transistor T17), replacement transistors are provided and are addressed using decoder logic.

Figure 5:
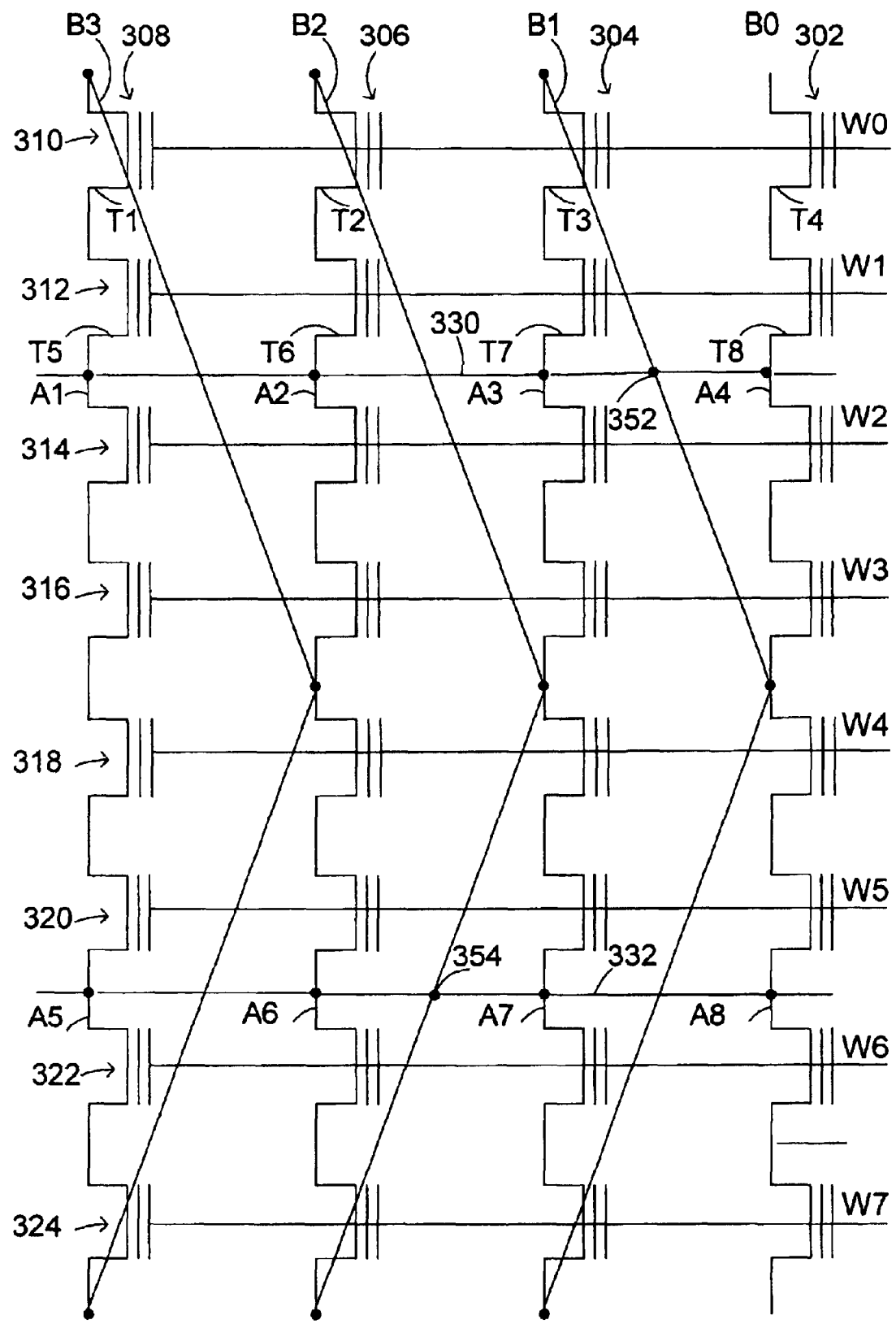
FIG. 5 is a schematic view of a second embodiment of memory array of the present invention.

The embodiment of FIGS. 2 and 3 shows a single transistor connected between and a pair of bit lines. However, it will be understood that any number of transistors can be connected between bit lines. For example, in the embodiment of FIG. 5, the transistors are laid out as in FIG. 2, but in this embodiment, pairs of transistors in a column are accessed through a pair of bit lines as described above, and the appropriate word lines associated with each of this pair of transistors.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory array comprising:
   a plurality of word lines;
   a plurality of bit lines;
   a first transistor associated with a first word line and connected in series with a second transistor associated with a second word line;
   the series-connected first and second transistors being connected between first and second bit lines;
   a region between the series-connected first and second transistors being connected to a bit line of the plurality thereof.

2. The memory array of claim 1 wherein the region by the series-connected first and second transistors is connected to one of the first and second bit lines.

3. The memory array of claim 2 wherein the first and second bit lines are adjacent bit lines.

4. The memory array of claim 3 wherein the region between the series-connected first and second transistors is connected to the first bit line, and further comprising a third transistor associated with a third word line and connected in series with a fourth transistor associated with a fourth word line, the series-connected third and fourth transistors being connected between the second bit line and a third bit line, a region between the series-connected third and fourth transistors being connected to the second bit line.

5. The memory array of claim 4 and further comprising:
   a fifth transistor associated with the first word line and in series with a sixth transistor associated with the second word line;
   a seventh transistor associated with the third line and connected in series with an eighth transistor associated with the fourth word line;
   a region between the series-connected fifth and sixth transistors being connected to the region between the series-connected first and second transistors, and a region between the series-connected third and fourth transistors being connected between the series-connected seventh and eighth transistors.

6. The memory array of claim 5 wherein a first row of the array comprises the first and fifth transistors, a second row of the array comprises the second and sixth transistors, a third row of the array comprises the third and seventh transistors, and a fourth row of the array comprises the fourth and eighth transistors.

7. The memory array of claim 6 wherein a first column of the array comprises the first, second, seventh and eighth transistors, and a second column of the array comprises third, fourth, fifth and sixth transistors.

8. The memory array of claim 7 wherein the first and second word lines are adjacent word lines, the second and third word lines are adjacent word lines, and the first, second and third word lines lie sequentially across the array.

9. The memory array of claim 6 wherein each bit line is made up of a plurality of connected segments, each segment being non-aligned with an adjacent segment.

10. The memory array of claim 9 wherein each bit line is of a zigzag configuration.

11. The memory array of claim 10 wherein the transistors are floating gate transistors.

* * * * *